United States Patent [19]

Kim et al.

[11] Patent Number: 5,705,416
[45] Date of Patent: Jan. 6, 1998

[54] METHOD OF MANUFACTURING A FLASH EEPROM CELL

[75] Inventors: Jong Oh Kim, Seoul; Sung Rae Kim, Ichon, both of Rep. of Korea

[73] Assignee: Hyundai Electronics Industries Co., Ltd., Kyungki-do, Rep. of Korea

[21] Appl. No.: 798,960

[22] Filed: Feb. 11, 1997

[30] Foreign Application Priority Data

Feb. 9, 1996 [KR] Rep. of Korea .............. 96-03165

[51] Int. Cl.$^6$ .............. H01L 21/265; H01L 21/8247
[52] U.S. Cl. .............................................. 437/43; 437/52
[58] Field of Search ............................... 437/43, 52

[56] References Cited

U.S. PATENT DOCUMENTS 5,512,503 4/1996 Hong et al. ...................... 437/43
5,589,413 12/1996 Sung et al. ...................... 437/43

Primary Examiner—John Niebling
Assistant Examiner—Richard A. Booth
Attorney, Agent, or Firm—Fish & Richardson P.C.

[57] ABSTRACT

This invention discloses a method of manufacturing a flash EEPROM cell having a split gate structure in which source and drain regions are formed by self align method without using of an additional mask. Problems caused by that length of control gates in each cell are different from each other due to the misalignment between a mask for forming the control gate and a mask for forming source and drain regions are solved since source and drain regions are formed by self align method without using of an additional mask.

4 Claims, 5 Drawing Sheets 5,705,416

1

METHOD OF MANUFACTURING A FLASH EEPROM CELL

FIELD OF INVENTION

This invention relates to a method of manufacturing a flash EEPROM cell, and more particularly to method of manufacturing a flash EEPROM cell having a split gate structure in which source and drain regions are formed by self align method without using of an additional mask.

BACKGROUND OF INVENTION

Generally, a flash EEPROM cell which is a non-volatile memory cell has both function of electrical program and erasure, the flash EEPROM cell being divided into a stack structure and a split gate structure.

FIG. 1 is a cross sectional view of a flash EEPROM cell having a stack structure in which a tunnel oxide layer 2A formed on a silicon substrate 1A, a floating gate 3A, an inter-oxide layer 4A, a control gate 5A, a drain region 6A, a source region 7A are formed.

FIG. 2 is a cross sectional view of a flash EEPROM cell having a split gate structure in which a tunnel oxide layer 2B formed on a silicon substrate 1B, a floating gate 3B, an inter-oxide layer 4B, a control gate 5B, a drain region 6B, a source region 7B are formed. However, the flash EEPROM cell having a split gate structure includes a select gate oxide layer 8B as shown in FIG. 2.

In processes of manufacturing the flash EEPROM cell having such a split gate structure, following problems are occurred.

In order to the control gate of the flash EEPROM cell in which a second polysilicon layer is formed in a split gate structure, an additional mask must be used after etching of a first polysilicon layer and length of control gates in each cell are different from each other due to the misalignment between a mask for forming the control gate and a mask for forming source and drain regions.

In addition, in order to the control gate of the flash EEPROM cell in which a third polysilicon layer is formed in a split gate structure, a additional mask must be used after etching of a first polysilicon layer and length of control gates in each cell are different from each other due to the misalignment between a mask for forming the control gate and a mask for forming source and drain regions.

Due to the above mentioned problems, there are problems in that uniformity such current flowing of the cell is lowered and length of select gates are different from each other, thereby lowering program characteristics.

Therefore, it is an object of the present invention to provide a method of manufacturing flash EEPROM cell having a split gate structure which can solve the above problems by forming source and drain regions in the means of self align method without using of an additional mask.

SUMMARY OF THE INVENTION

To achieve the above object, a method of manufacturing flash EEPROM cell having a split gate structure according to an embodiment of the present invention comprises the steps of: sequentially forming a tunnel oxide layer and a first polysilicon layer, depositing a first nitride layer on the first polysilicon layer and then patterning the first nitride layer; forming a first oxide layer on the first polysilicon layer exposed between the patterned first nitride layers; coating a first photoresist on the resulting structure after forming the

2 first oxide layer and patterning the first photoresist; forming a first junction region in the silicon substrate by implanting an impurity ion into the silicon substrate using the patterned first photoresist and the first nitride layer as a mask; removing the first oxide layer over the first junction region, the patterned first photoresist and the first nitride layer; forming a floating gate by selectively etching the first polysilicon layer and the tunnel oxide layer; forming a second junction region by implanting an impurity ion into the exposed silicon substrate; sequentially forming a second oxide layer and a second nitride layer on the resulting structure after forming the second junction region; selectively etching the second oxide layer and the second nitride layer so that a portion of the second oxide layer and the second nitride layer is remained at an upper portion and a side wall of the floating gate, thereby forming a cell spacer; and sequentially forming a third oxide layer and a second polysilicon on the resulting structure after forming the cell spacer.

A method of manufacturing flash EEPROM cell having a split gate structure according to another embodiment of the present invention comprises the steps of: sequentially forming a tunnel oxide layer, a first polysilicon layer, an ONO layer and a second polysilicon layer on a silicon substrate; depositing a nitride layer on the second polysilicon layer and then patterning said nitride layer; forming a first oxide layer on the second polysilicon layer exposed between the patterned nitride layers; coating a first photoresist on the resulting structure after forming said first oxide layer and patterning the first photoresist; selectively etching the second polysilicon layer, the ONO layer, the first polysilicon layer and the tunnel oxide layer using the first photoresist and the nitride layer as a mask; forming a first junction region by implanting an impurity ion into the exposed silicon substrate; forming a second oxide layer on the first junction region; selectively etching the nitride layer, the second polysilicon layer, the ONO layer, the first polysilicon layer and the tunnel oxide layer using the remained first oxide layer and the second oxide layer as an etching barrier layer thereby forming first and second gates which are isolated from each other; forming a second junction region by implanting an impurity ion into the silicon substrate exposed between the first and second gates; depositing a third oxide layer on the resulting structure after forming the second junction region and patterning the third oxide layer, thereby forming a cell spacer; forming an insulating layer on the resulting structure after forming a cell spacer and patterning the insulating layer, thereby forming an inter-insulating layer; forming a fourth oxide layer on the exposed silicon substrate and then forming a third polysilicon layer on the resulting structure after forming the fourth oxide layer.

BRIEF DESCRIPTION OF THE DRAWINGS

Other objects and advantages of the present invention will be understood by reading the detailed explanation of the embodiment with reference to the accompanying drawings in which.

DETAILED DESCRIPTION OF THE INVENTION

FIG. 3A through FIG. 3E are cross sectional views for explaining a flash EEPROM cell according to a first embodiment of the present invention.

Figure 1:
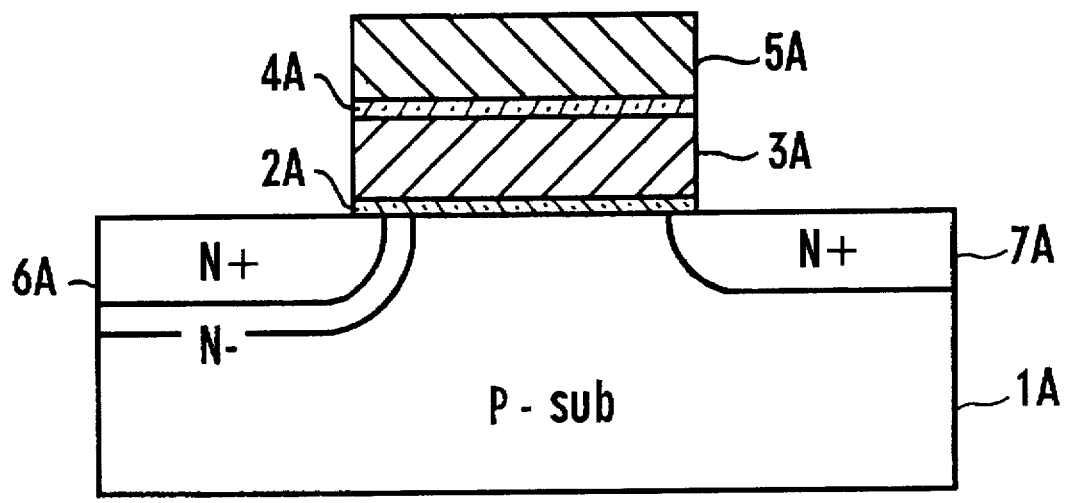
FIG. 1 and FIG. 2 are cross sectional views of conventional flash EEPROM cells having a stack structure and a split gate structure, respectively.
Figure 2:
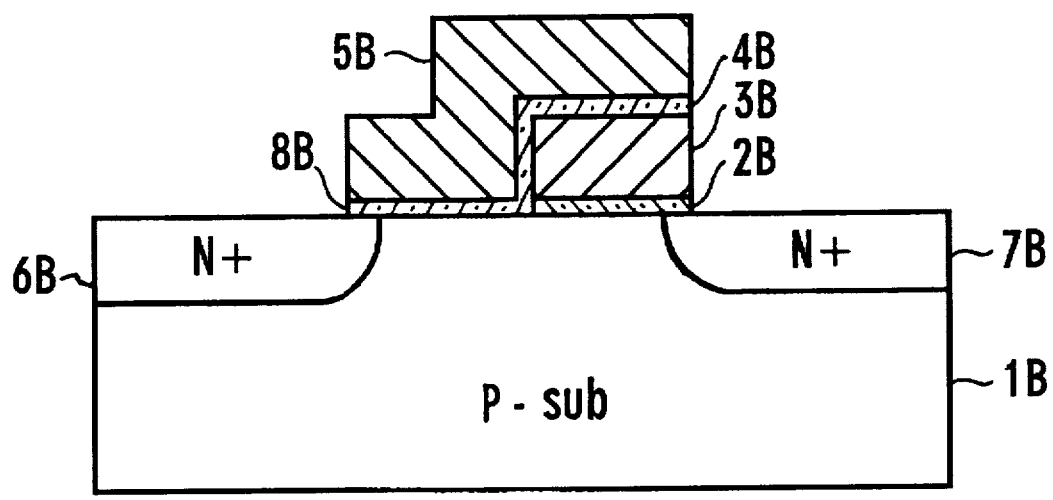
Figure 3A:
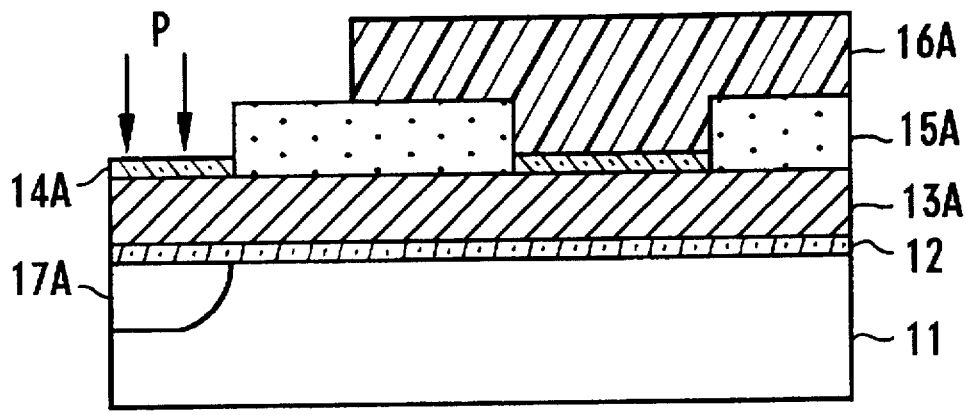
FIG. 3A through FIG. 3E are cross sectional views for explaining a flash EEPROM cell according to a first embodiment of the present invention.

As shown in FIG. 3A, a tunnel oxide layer 12 and a first polysilicon layer 13A is sequentially formed on a silicon substrate 11. A first nitride layer 15A is deposited on the first polysilicon layer 13A and the first nitride layer 15A is then selectively etched by an etching process. A first oxide layer 14A is formed on the first polysilicon layer 13A exposed between the patterned first nitride layers 15A. A first photoresist 16A is coated on the entire structure including the first polysilicon layer 13A and the first oxide layer 14A and then patterned by a photolithography process. A first junction region 17A is formed in the silicon substrate 11 by implanting an impurity ion such as phosphorous through the exposed first oxide layer 14A using the patterned first photoresist 16A and the first nitride layer 15A as a mask.

Figure 3B:
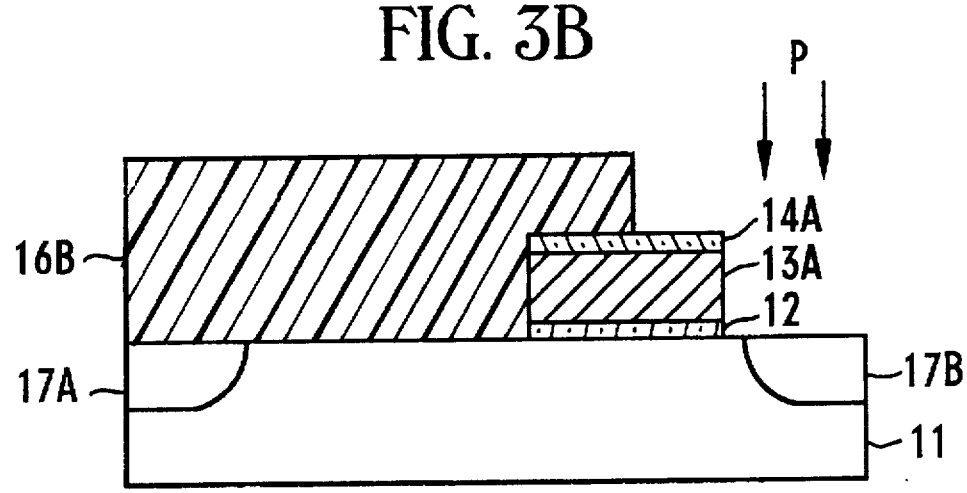

Referring to FIG. 3B, the first oxide layer 14A over the first junction region 17A in which an impurity ion is implanted, the patterned first photoresist 16A and the first nitride layer 15A are removed by an etching process. An exposed portion of the first polysilicon layer 13A and the tunnel oxide layer 12 is etched by a self-alinement etching process using the first oxide layer 14A remained on the first polysilicon layer 13A as an etching barrier layer. A second photoresist 16B is coated on the resulting structure after etching the exposed portion of the first polysilicon layer 13A and the tunnel oxide layer 12, and then patterned by a photolithography process. A second junction region 17B is formed in the silicon substrate 11 by implanting an impurity ion to the exposed silicon substrate 11 using the patterned second photoresist 16A and the residual first oxide layer 14A as a mask.

Figure 3C:
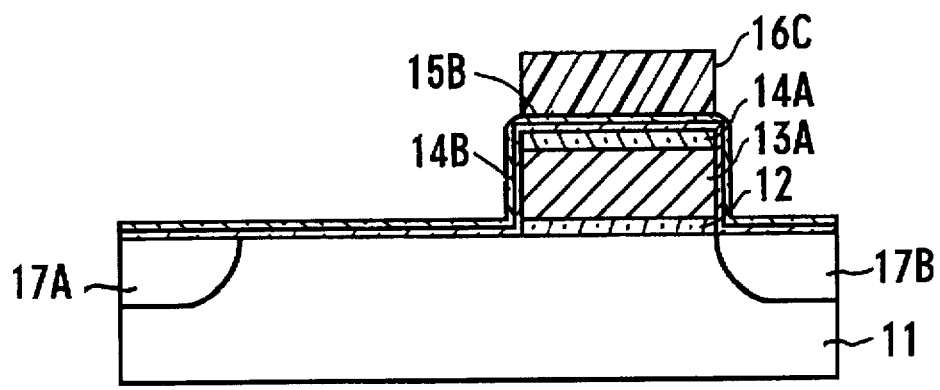

As shown in FIG. 3C, a second oxide layer 14B and a second nitride layer 15B are sequentially formed on the resulting structure after removing the patterned second photoresist 16A and a third photoresist pattern 16C is then formed on the second nitride layer 15B with width identical to that of the first polysilicon layer 13A which is a floating gate.

Figure 3D:
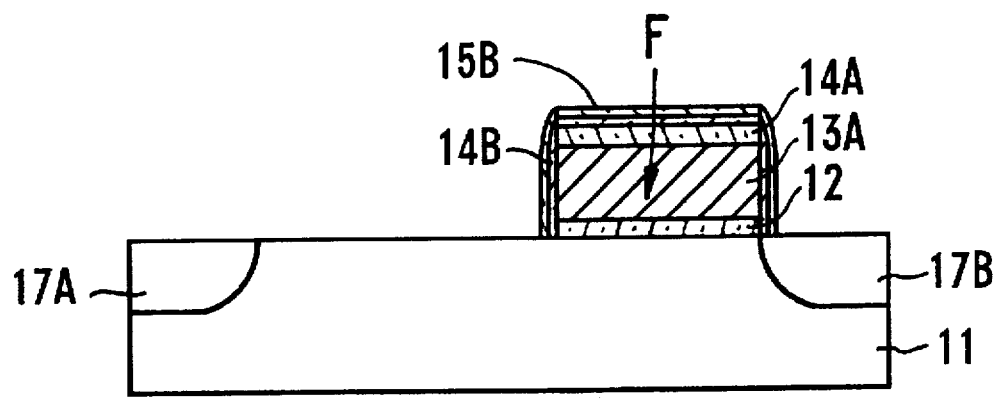

FIG. 3D illustrates the formation in which a portion of the second oxide layer 14B and the second nitride layer 15B is etched by an etching process using the third photoresist pattern 16C as a mask. The second oxide layer 14B and the second nitride layer 15B is remained at an upper portion of a floating gate F and both side walls thereof, wherein the second oxide layer 14B formed at both side walls at the floating gate F acts as a spacer.

Figure 3E:
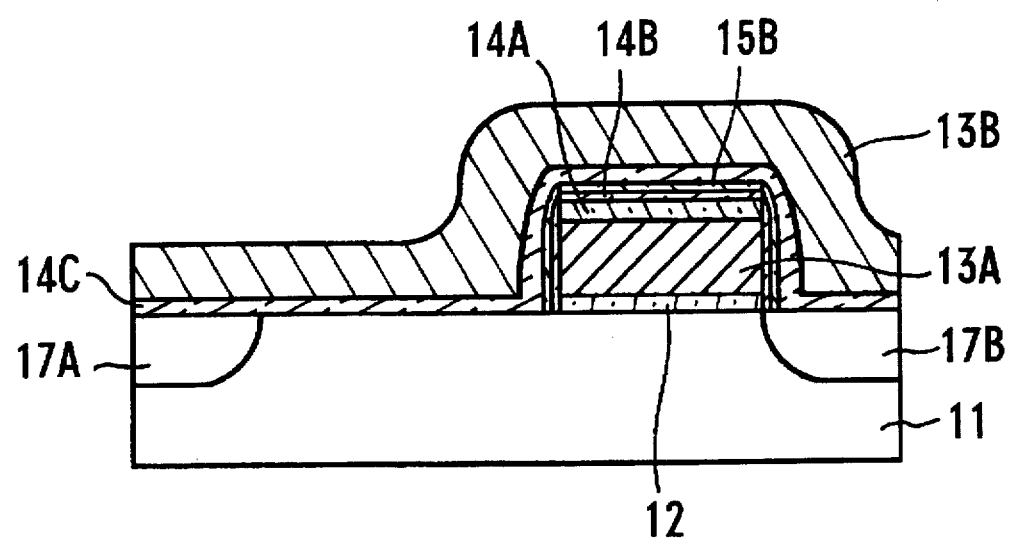

FIG. 3E illustrates the formation in which a third oxide layer 14C and a second polysilicon layer 13B are formed on the resulting structure after etching the portion of the second oxide layer 14B and the second nitride layer 15B. The third oxide layer 14C acts as a gate oxide layer of a select transistor. A flash EEPROM cell having a split structure is formed by selectively etching the second polysilicon layer 13B by means of an etching process using a poly mask.

In processes of FIG. 3C, the first oxide layer 14A may be removed after forming the first junction region 17A which is formed by implanting an impurity ion. On the contrary, the first oxide layer 14A is firstly removed and then the first junction region 17A may be formed. Also, an ON structure having the second oxide layer and the second nitride layer may be substituted by an ONO structure having an oxide layer, an nitride layer and an oxide layer.

FIG. 4A through FIG. 4E are cross sectional views for explaining a flash EEPROM cell according to a second embodiment of the present invention.

Figure 4A:
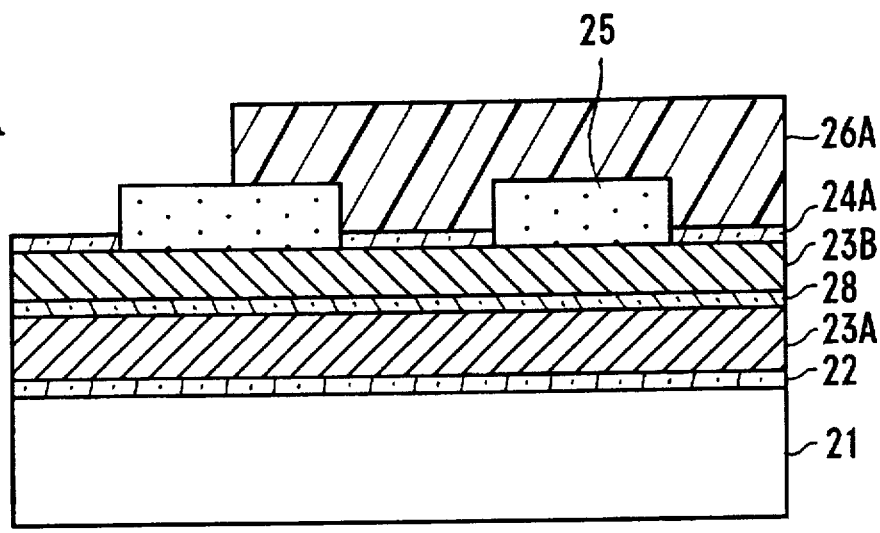
FIG. 4A through FIG. 4E are cross sectional views for explaining a flash EEPROM cell according to a second embodiment of the present invention.

As shown in FIG. 4A, a tunnel oxide layer 22, a first polysilicon layer 23A, an ONO layer 28 and a second polysilicon layer 23B are sequentially formed on a silicon substrate 21. A nitride layer 25 such as a $Si_3N_4$ layer is deposited on the second polysilicon layer 23B and then selectively patterned using an etching process. A first oxide layer 24A is formed on the second polysilicon layer 23B exposed between the patterned nitride layers 25. A first photoresist 26A is coated on the entire structure, and then patterned by photolithography process.

Figure 4B:
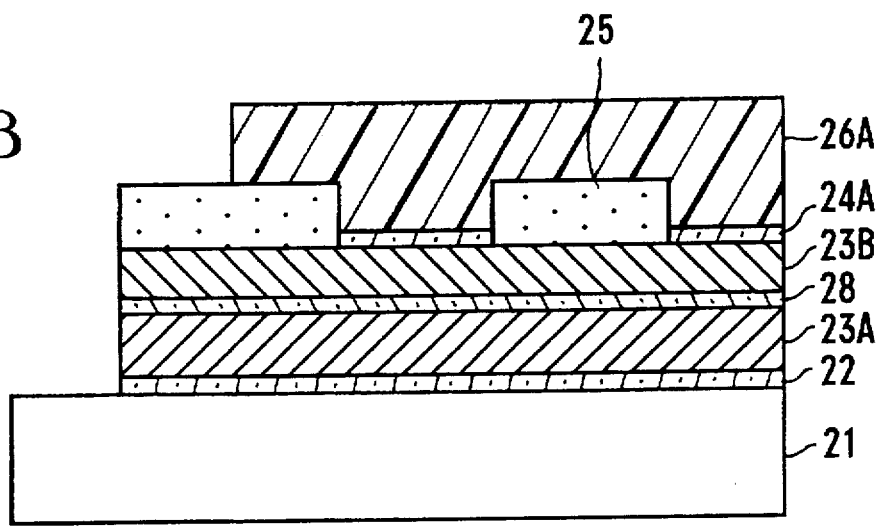

FIG. 4B illustrates the formation in which exposed portions of the first oxide layer 24A, the second polysilicon layer 23B, the ONO layer 28, the first polysilicon layer 23A and the tunnel oxide layer 22 are selectively etched using the patterned photoresist 26A and the nitride layer 25 as a mask.

Figure 4C:
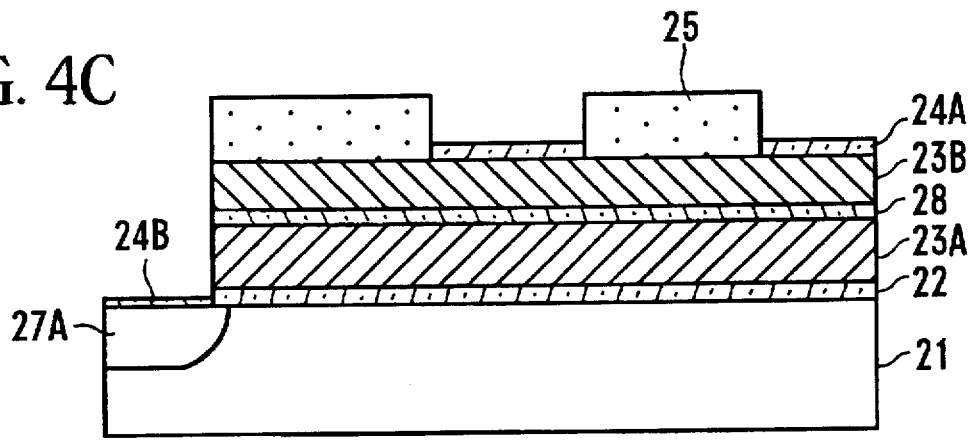

Referring to FIG. 4C, after exposed portions of the first oxide layer 24A, the second polysilicon layer 23B, the ONO layer 28, the first polysilicon layer 23A and the tunnel oxide layer 22 are etched, a first junction region 27A is formed by implanting an impurity ion into an exposed silicon substrate 21. A second oxide layer 24B is formed on the first junction region 27A. The first polysilicon layer 23A acts as a floating gate.

Figure 4D:
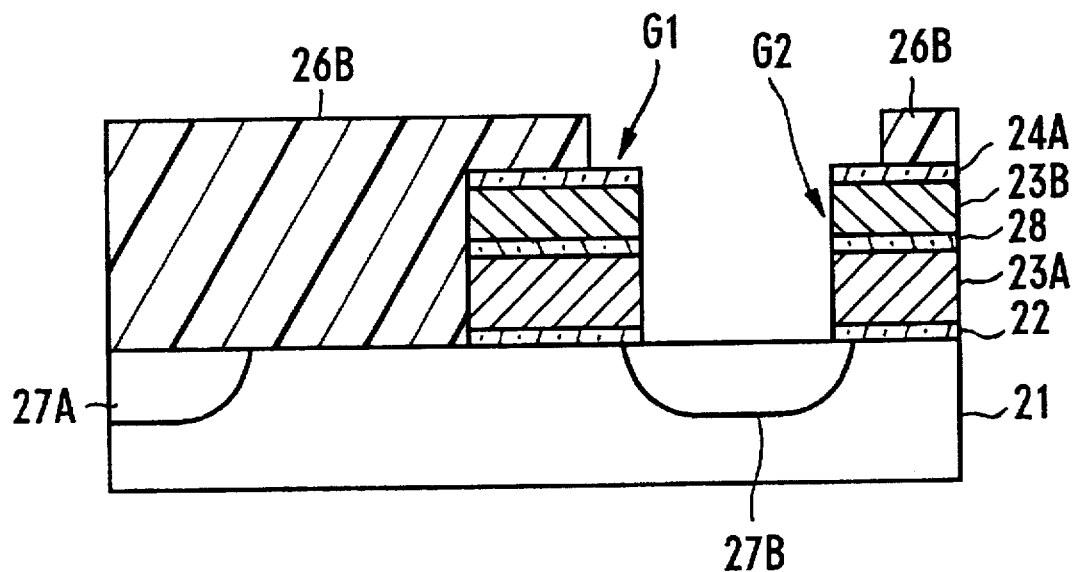
Figure 4E:
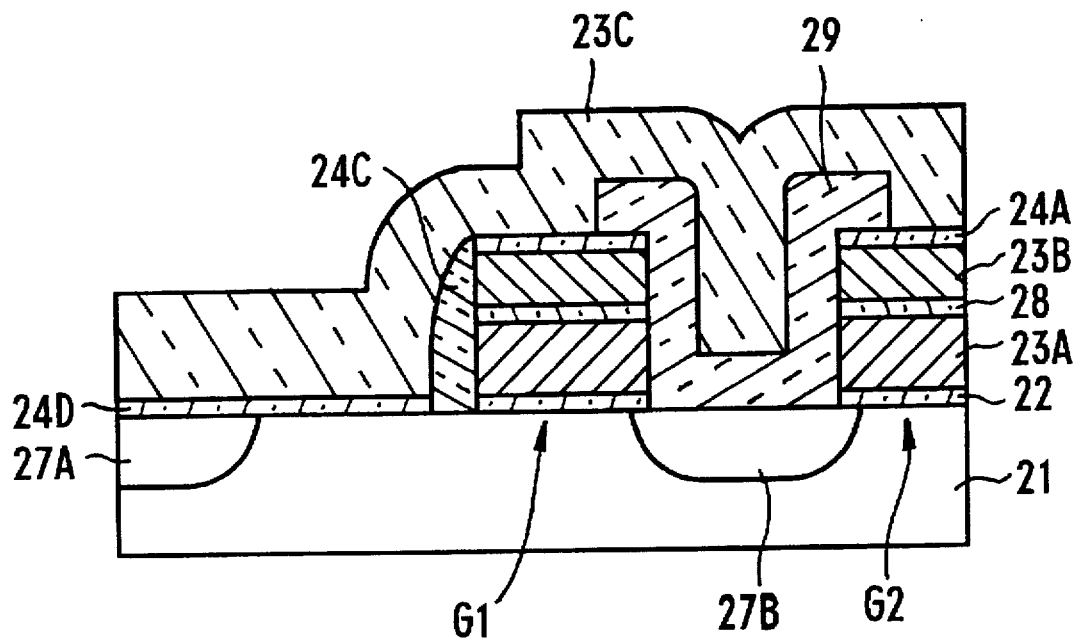

Subsequent processes will be described with reference to FIG. 4D and FIG. 4E. A first and second gates G1 and G2 which are isolated from each other are formed by selectively etching the nitride layer 25, the second polysilicon layer 23B, the ONO layer 28, the first polysilicon layer 23A and the tunnel oxide layer 22 using the first oxide layer 24A and the second oxide layer 24A, which are formed on the second polysilicon layer 23B, as an etching barrier layer, wherein each of the first and second gates G1 and G2 has a stack structure in which the first polysilicon 23A and the second polysilicon 23B are stacked. A second photoresist 26B is coated on the resulting structure after forming the first and second gates G1 and G2 and then patterned through the photolithography process. A second junction region 27B is formed by implanting an impurity ion into the silicon substrate 21 exposed between the first and second gates G1 and G2.

A third oxide layer 24C is deposited on the resulting structure after forming the second junction region 27B and then etched by a blanket etching process, whereby a cell spacer is formed. An oxide layer is deposited on the resulting structure after etching the third oxide layer 24C and then patterned by an etching process, thereby forming an inter-oxide layer 29 between the first and second gates G1 and G2. A fourth oxide layer 24D is formed on the silicon substrate 21 exposed by patterning the inter-oxide layer 29 and a third polysilicon layer 23C is then formed on resulting structure after forming the fourth oxide layer 24D.

In the processes of FIG. 4A, thermal process may be performed after forming $Si_3N_4$ layer so that oxidation is selectively occurred over the second polysilicon layer.

As described above, according to the first and second embodiments of the present invention, in a flash EEPROM cell having a split gate structure, source and drain regions are formed by self align method without using of an additional mask. There is an effect in that problems caused by that length of control gates in each cell are different from each other due to the misalignment between a mask for forming the control gate and a mask for forming source and drain regions are solved.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a flash EEPROM cell comprising, the steps off:

sequentially forming a tunnel oxide layer and a first polysilicon layer;

depositing a first nitride layer on said first polysilicon layer and then patterning said first nitride layer;

forming a first oxide layer on said first polysilicon layer exposed between the patterned first nitride layer;

coating a first photoresist on the resulting structure after forming said first oxide layer and patterning said first photoresist;

forming a first junction region in said silicon substrate by implanting an impurity ion into said silicon substrate using the patterned first photoresist and said first nitride layer as a mask;

removing said first oxide layer over said first junction region, said patterned first photoresist, and said first nitride layer;

forming a floating gate by selectively etching said first polysilicon layer and said tunnel oxide layer and exposing the silicon substrate;

forming a second junction region by implanting an impurity ion into the exposed silicon substrate;

sequentially forming a second oxide layer and a second nitride layer on the resulting structure after forming said second junction region;

selectively etching said second oxide layer and said second nitride layer so that a portion of said second oxide layer and said second nitride layer remains at an upper portion and a side wall of said floating gate, thereby forming a cell spacer; and sequentially forming a third oxide layer and a second polysilicon on the resulting structure after forming said cell spacer.

2. The method of claim 1, wherein said floating gate is longed by a self-alignment etching process using said first oxide layer remaining on said first polysilicon layer as an etching barrier layer.

3. The method of claim 1, wherein said impurity ion is phosphorous.

4. A method of manufacturing a flash EEPROM cell having a split gate structure comprising, the steps of:

sequentially forming a tunnel oxide; layer, a first polysilicon layer, an ONO layer and a second polysilicon layer on a silicon substrate;

depositing a nitride layer on said second polysilicon layer and then patterning said nitride layer;

forming a first oxide layer on said second polysilicon layer exposed between the patterned nitride layer;

coating a first photoresist on the resulting structure after forming said first oxide layer and patterning said first photoresist;

selectively etching said first oxide layer, second polysilicon layer, said ONO layer, said first polysilicon layer and said tunnel oxide layer and exposing the silicon substrate using said first photoresist and said nitride layer as a mask;

forming a first junction region by implanting an impurity ion into the exposed silicon substrate;

forming a second oxide layer on said first junction region;

selectively etching said nitride layer, said second polysilicon layer, said ONO layer, said first polysilicon layer and said tunnel oxide layer using a remaining portion of said first oxide layer and said second oxide layer as an etching barrier layer thereby forming first and second gates which are isolated from each other;

forming a second junction region by implanting an impurity ion into said silicon substrate exposed between said first and second gates;

depositing a third oxide layer on the resulting structure after forming said second junction region and patterning said third oxide layer, thereby forming a cell spacer;

forming an insulating layer on the resulting structure after forming a cell spacer and patterning said insulating layer, thereby forming an inter-insulating layer; and forming a fourth oxide layer on the exposed silicon substrate and then forming a third polysilicon layer on the resulting structure after forming said fourth oxide layer.

* * * * *